United States Patent [19]

Cooper et al.

[11] 4,233,863
[45] Nov. 18, 1980

[54] FOIL APPLICATOR TOOL

[75] Inventors: William C. Cooper; Alberto A. Garcia, both of Seattle, Wash.

[73] Assignee: Linda F. O'Brien, Seattle, Wash.

[21] Appl. No.: 915,276

[22] Filed: Jun. 13, 1978

[51] Int. Cl.³ .......................... B31F 1/00; B25B 27/00
[52] U.S. Cl. .................................... 81/3 R; 156/468; 29/243.58
[58] Field of Search ................. 29/243.5, 243.58, 270; 81/1 R, 3 R; 156/107, 109, 202, 461, 466, 468; 264/296; 206/389, 403, 411

[56] References Cited

U.S. PATENT DOCUMENTS

| 51,161 | 11/1865 | Ensign . | |
|---|---|---|---|
| 455,666 | 7/1891 | Housman . | |
| 1,243,728 | 10/1917 | Gagnon . | |
| 1,498,638 | 6/1924 | Periolat | 81/3 R X |
| 2,699,601 | 1/1955 | Darnell | 269/296 X |
| 2,991,213 | 7/1961 | Williams . | |
| 3,290,195 | 12/1966 | Davis | 156/468 X |
| 3,420,730 | 1/1969 | Ellefson . | |
| 3,466,214 | 9/1969 | Polk et al. . | |
| 3,512,320 | 5/1970 | Ferron et al. . | |
| 3,516,884 | 6/1970 | Heeter et al. . | |
| 3,546,051 | 12/1970 | Utz . | |
| 3,563,835 | 2/1971 | Nussbaum et al. . | |
| 3,733,237 | 5/1973 | Wolff | 156/109 X |
| 3,886,013 | 5/1975 | Bowser et al. | 156/109 |
| 3,935,055 | 1/1976 | Carmien . | |
| 4,115,180 | 9/1978 | Scalia | 156/468 X |

*Primary Examiner*—James G. Smith
*Attorney, Agent, or Firm*—David H. Deits; Roy E. Mattern, Jr.; Kenneth S. Kessler

[57] ABSTRACT

A foil applicator tool for use in construction of stained glass panel assemblies is formed by a body having a plurality of grooves each of which have an upper portion with a base formed by shoulders for supporting foil in strip form. The upper portion has parallel side walls which closely receive the foil strip. Each groove has a lower portion centrally located with respect to the upper portion. The walls of the lower portion are parallel and closely receive the marginal edge of a stained glass panel and foil to fold the foil about the edge of the glass when it is pressed down into the lower portion of the groove with the foil interposed. The grooves extend over a substantially planar top surface of the tool body and over a curved end surface.

3 Claims, 6 Drawing Figures

FOIL APPLICATOR TOOL

BACKGROUND OF THE INVENTION

1. Field of the Invention

The invention is a tool for applying metal foil, most commonly copper foil, to the margins of glass panels such as those used in stained glass windows. After the foil is applied to the panels, it is tinned and individual panels are then soldered together at their edges to form a complete assembly. The foil is normally, adhesively backed. It is most commonly supplied in coils wound on paper cores with a removable paper backing covering the adhesively coated surface.

2. Prior Art

The foil has in the past been applied to the edge of the glass panel by hand. A strip of foil is aligned with the panel edge and then the opposite sides of the foil strip are bent over so that the foil wraps about the edge of the glass panel.

SUMMARY OF THE INVENTION

A foil applicator tool is provided to apply foil strip to the marginal edge of panels for stained glass windows. The tool body has a substantially planar top surface and a curved end surface. A plurality of differently dimensioned grooves extend over the two surfaces. Each groove has an upper portion with a base formed by shoulders for supporting the unfolded foil. The upper portion also has parallel sidewalls which closely receive the foil strip. Each groove also has a lower portion centrally located with respect to the upper portion. The walls of the lower portion are parallel and closely receive the marginal edge of the glass and foil when it is pressed down into the lower portion of the groove with the foil interposed. The base of the lower portion of the groove is also preferably flat.

DETAILED DESCRIPTION OF THE INVENTION

Figure 1:
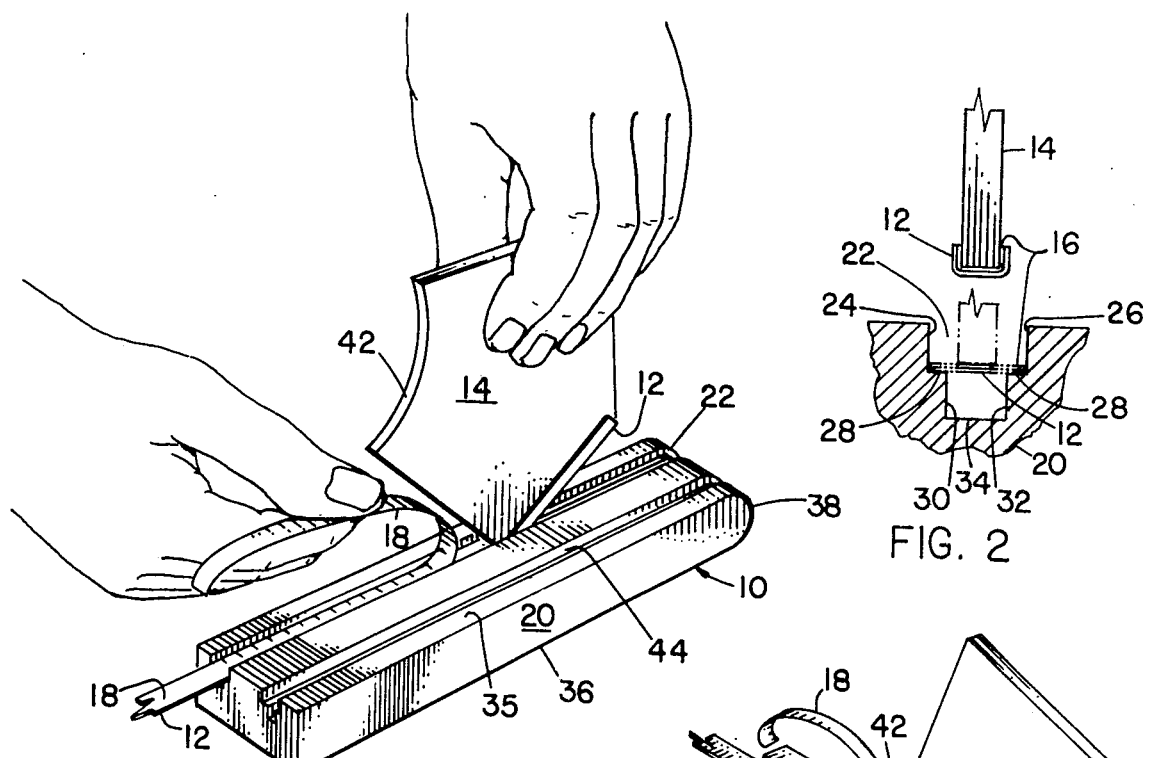
FIG. 1 is a perspective view of the foil applicator tool in use.

The foil applicator tool 10, shown in its preferred form in the drawings is utilized, in the manner described below, to apply foil 12 to the marginal edge of panels 14 such as glass panels used in stained glass windows, Tiffany lamps, or the like.

In the construction of stained glass windows or other such assemblies of glass panels, the individual glass panels which comprise the components of the assembly are covered on their marginal edges with a foil material, such as thin copper foil. The foil is then tinned and then the individual panels are soldered together to form the complete assembly. This foil, usually available in coiled rolls, is typically hand applied to the panel edge. The foil 12 normally has an adhesive coating 16 on one surface. This surface is protected by a paper backing 18 typically.

Figure 2:
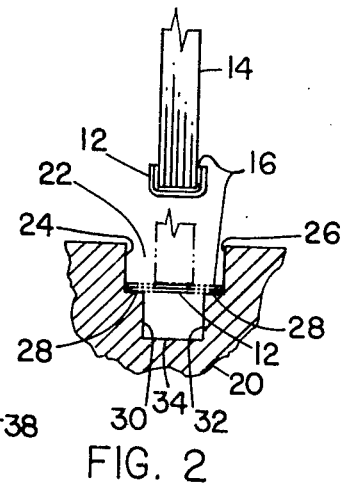
FIG. 2 is an enlarged transverse section view of the tool also showing a marginal edge of a glass panel with foil applied and with the pre-application positions of the foil and glass shown in phantom.

The foil applicator tool 10 consists of a body 20 having a groove 22 in its surface. The body may be made of any material such as wood or more preferably a high density polyethylene. The groove has an upper portion which is wide enough to receive the foil strip 12. The upper portion has side walls 24 and 26 which are preferably parallel and spaced so as to closely receive the foil strip 12, as shown in FIG. 2. The base 28 of the upper portion of the groove is preferably normal to the side walls and supports the foil in an unfolded condition. The groove also has a lower portion, preferably centrally located with respect to the upper portion, also having side walls 30 and 32 respectively which are preferably parallel to each other and the walls 24 and 26. The walls 30 and 32 are more closely spaced so that the lower portion is narrower than the upper portion of the groove. The side walls 30 and 32 are spaced so as to closely receive the glass panel 14 with the foil 12 folded about its marginal edge. The lower portion also has a base 34 which is preferably flat and normal to the sidewalls. Preferably the body has a substantially flat top surface 35 across which the groove 22 extends in a parallel relation thereto and a parallel planar base 36. Also the body preferably has a curved surface, such as the convexly curved end 38. The groove preferably extends continuously over the curved surface of the end following its curvature.

Figure 3:
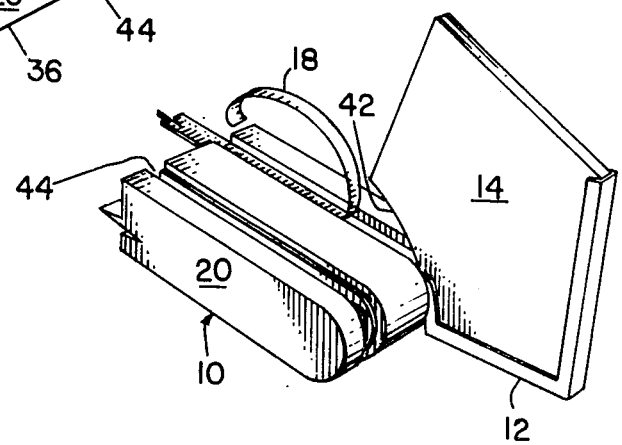
FIG. 3 is a perspective view of the tool in use illustrating the application of foil to a concavely curved edge of the glass.
Figure 4:
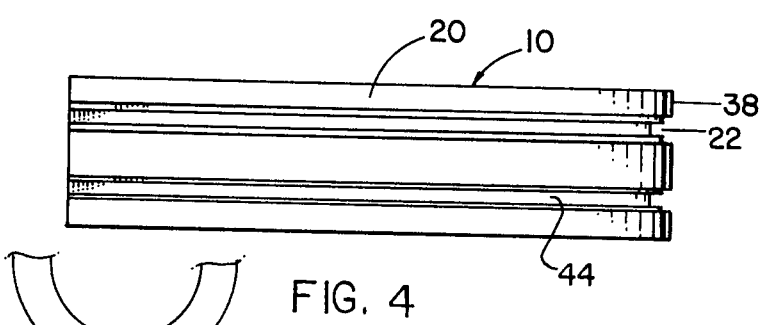
FIG. 4 is a top plan view of the tool.
Figure 5:
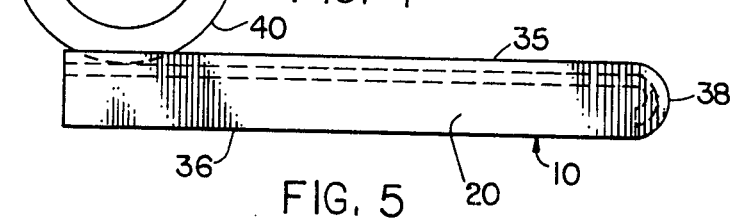
FIG. 5 is a side elevation view of the tool with the groove shown in dotted lines and part of a coil of foil shown to illustrate how the tool can support it.
Figure 6:
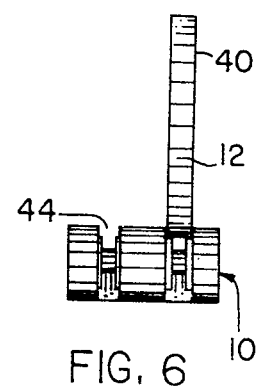
FIG. 6 is an end elevation view of the curved end again showing a coil of foil stored in the groove.

To use the tool 10 the foil is laid, adhesive side up, in the groove 22 with its edges supported by the shoulders forming the base 28 of the upper portion, as is illustrated in phantom in FIG. 2. The paper backing 18 is peeled to expose the adhesive 16. The glass panel is then centrally positioned over the groove 22 as shown in FIG. 2 and then forced downward within the lower portion of the groove. The contact with the the shoulders which form the base of the upper portion of the groove and the side walls 30 and 32 of the lower portion cause the foil to be neatly folded about the edge of the glass. The pressure of the base 34 and sidewalls 30 and 32 caused by the close fit couple with the adhesive to cause the foil to adhere securely in position. The process is repeated for adjacent sections of the perimeter of the glass with a continuous piece of foil extending about the full perimeter of the glass panel. Between the steps of applying the foil to successive sections of the margin of the glass panel the coil 40 of foil may be supported upright in the groove 22 for convenience and to avoid folding the foil. In applying the foil to convex curves of a glass panel the curved edge of the glass may be inserted in the flat portion of the groove 22 with a rolling motion to apply the foil. In applying foil to concave curves as at 42 the curved end of the tool is utilized as illustrated in FIG. 3 using a similar rolling motion but using the convexly curved portion of the groove.

Preferably, since more than one thickness of glass may be used as well as foil of different widths the tool 10 is provided with one or more additional grooves of a different size, such as 44, to accommodate other size combinations of foil and glass.

As an illustrative example of the size of a groove 22 for applying $\frac{1}{4}$ inch wide foil to a $\frac{1}{8}$ inch thick glass panel, the nominal dimensions preferred are:

Width of upper portion of groove: ¼ inch;
Depth of upper portion of groove: ¼ inch;
Width of lower portion of groove: 5/32 inch;
Depth of lower portion of groove: ⅛ inch.

The width of the upper portion of the groove preferably is only a few one-thousands of an inch wider than the foil width; just enough to let it enter the groove in a flat condition. For applying 3/16 inch wide foil to an ⅛ inch thick glass panel only the dimension of the upper portion of the groove is altered to a nominal dimension of 3/16 inch. The other dimensions preferably remain the same.

We claim:

1. A foil applicator tool for applying foil strip to the marginal edges of glass panels comprising a body having a substantially planar surface and an adjacent curved surface and having an elongated groove including means for receiving and supporting the foil strip in an unfolded condition which forms an upper portion of the groove and means for closely receiving the marginal edge of the glass panel and foil about the panel edge which forms a lower portion of the groove which is narrower than the upper portion and wherein the body defines the groove such that it extends over the planar surface in a parellel relation thereto and the curved surface following the curvature thereof.

2. A foil applicator tool as claimed in claim 1, wherein the body defines the groove to extend continuously from the planar surface over the curved surface following the curvature thereof, to have in the upper portion parallel sides spaced closely to receive the foil and a base normal to the side for supporting the foil, and to have a lower portion centrally located with respect to the upper portion having parallel side walls spaced closely to receive the panel with foil folded about its marginal edge and a base normal to the side walls.

3. A foil applicator tool as claimed in claim 1, wherein there are a plurality of such grooves which are differently sized.

* * * * *